(12) United States Patent
Kim et al.

(10) Patent No.: US 11,132,094 B2
(45) Date of Patent: Sep. 28, 2021

(54) ELECTRONIC APPARATUS

(71) Applicant: Samsung Display Co., Ltd., Yongin-si (KR)

(72) Inventors: Sunghee Kim, Cheonan-si (KR); Sung-Jin Yang, Cheonan-si (KR); Hyunsik Park, Cheonan-si (KR); Chungi You, Anyang-si (KR); Sungho Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/905,156

(22) Filed: Jun. 18, 2020

(65) Prior Publication Data
US 2020/0409508 A1 Dec. 31, 2020

(30) Foreign Application Priority Data
Jun. 28, 2019 (KR) .......................... 10-2019-0078197

(51) Int. Cl.
*G06F 3/044* (2006.01)
*G06F 3/047* (2006.01)
*H01L 27/32* (2006.01)

(52) U.S. Cl.
CPC .......... *G06F 3/0445* (2019.05); *G06F 3/047* (2013.01); *G06F 3/0446* (2019.05);
(Continued)

(58) Field of Classification Search
CPC .... G06F 3/0443; G06F 3/0446; G06F 3/0412; G06F 3/04164; G06F 2203/04111;
(Continued)

(56) References Cited

U.S. PATENT DOCUMENTS 8,730,191 B2 5/2014 Kim et al.
2011/0057893 A1 3/2011 Kim et al.
(Continued)

FOREIGN PATENT DOCUMENTS

KR 10-1082293 B1 11/2011
KR 10-2012-0043406 A 5/2012
(Continued)

*Primary Examiner* — Deeprose Subedi
(74) *Attorney, Agent, or Firm* — Lewis Roca Rothgerber Christie LLP

(57) ABSTRACT

An electronic apparatus includes a plurality of first sensing electrodes, a plurality of second sensing electrodes, a plurality of first sensing lines, a plurality of second sensing lines, and a connection line connecting two second sensing patterns, which are spaced apart from each other, of one second sensing electrode of the second sensing electrodes. Each of the first sensing lines includes a trench line connected to one first sensing electrode of the first sensing electrodes and crossing the connection line so as to be insulated from the connection line. The connection line includes a plurality of line parts spaced apart from each other with the trench line therebetween on a plane and a bridge part on a layer different from that on which the line parts are on, the bridge part connecting the line parts to each other and having conductivity less than that of the trench line.

20 Claims, 13 Drawing Sheets

(52) U.S. Cl.
CPC ........ *H01L 27/323* (2013.01); *H01L 27/3276* (2013.01); *G06F 2203/04112* (2013.01)

(58) Field of Classification Search
CPC ................... G06F 3/0445; G06F 3/047; G06F 2203/04112; H01L 27/323; H01L 27/3276
USPC ................................................. 345/173, 174
See application file for complete search history.

(56) References Cited

U.S. PATENT DOCUMENTS

| | | | |
|---|---|---|---|
| 2015/0009427 A1* | 1/2015 | Chen | G06F 3/0446 349/12 |
| 2015/0220191 A1* | 8/2015 | Huh | G06F 3/0446 345/173 |
| 2017/0364194 A1 | 12/2017 | Jang et al. | |
| 2019/0109184 A1* | 4/2019 | Li | G09G 3/3688 |
| 2019/0227362 A1* | 7/2019 | Sun | G02F 1/1333 |
| 2019/0296051 A1* | 9/2019 | Qin | H01L 27/124 |
| 2020/0176478 A1* | 6/2020 | Wu | H01L 27/124 |

FOREIGN PATENT DOCUMENTS

| | | |
|---|---|---|
| KR | 10-2015-0077831 A | 7/2015 |
| KR | 10-2017-0142243 A | 12/2017 |

* cited by examiner

ELECTRONIC APPARATUS

CROSS-REFERENCE TO RELATED APPLICATION

This application claims priority to and the benefit of Korean Patent Application No. 10-2019-0078197, filed on Jun. 28, 2019, the entire contents of which are incorporated herein by reference.

BACKGROUND

1. Field

Embodiments of the present disclosure herein relate to an electronic apparatus, and, for example, to an electronic apparatus that senses an external input.

2. Description of the Related Art

Electronic apparatuses are activated according to an electrical signal. Such electronic apparatuses are constituted by (e.g., include) various suitable electronic components such as an electronic panel and an electronic module. The electronic panel may include a display unit that displays an image and a sensing unit that senses an external input. The electronic components may be electrically connected to each other by signal lines, which are variously arranged.

The display unit includes a light emitting element that generates an image. The sensing unit may include sensing electrodes for sensing an external input. The sensing electrodes are in an active area. The sensing unit is designed to provide uniform (e.g., substantially uniform) sensitivity on an entire surface of the active area.

SUMMARY

Embodiments of the present disclosure provide an electronic apparatus having improved reliability.

An embodiment of the present disclosure provides an electronic apparatus including: a base substrate; a plurality of first sensing electrodes on the base substrate; a plurality of second sensing electrodes spaced apart from the first sensing electrodes; a plurality of first sensing lines connected to ends of the first sensing electrodes, respectively; a plurality of second sensing lines respectively connected to ends of the second sensing electrodes and spaced apart from the first sensing lines; and a connection line configured to connect two second sensing patterns, which are spaced apart from each other, among second sensing patterns of one second sensing electrode of the second sensing electrodes to each other, wherein each of the first sensing lines includes a trench line connected to one first sensing electrode of the first sensing electrodes and crossing the connection line so as to be insulated from the connection line, and wherein the connection line includes: a plurality of line parts on the same layer as the trench line and spaced apart from each other with the trench line therebetween on a plane; and a bridge part on a layer that is different from that on which the line parts are on and overlapping the trench line on the plane, the bridge part being configured to connect the line parts to each other, wherein the bridge part has conductivity (e.g., electrical conductivity) less than that of the trench line.

In an exemplary embodiment, the trench line may be on the bridge part in a cross-section (e.g., in a cross-sectional view).

In an exemplary embodiment, each of the line parts may include a metal, and the bridge part may include transparent conductive oxide.

In an exemplary embodiment, each of the line parts may include: a first layer including the metal; and a second layer on the first layer and including the same (e.g., substantially the same) material as the bridge part, wherein the first layer and the second layer may contact (e.g., directly or physically contact) each other in the cross-section (e.g., in the cross-sectional view).

In an exemplary embodiment, the trench line may include: a first portion extending in a first direction and spaced apart from the first sensing electrode in a second direction crossing the first direction; a second portion extending from the first portion in the second direction and connected to the first sensing electrode; and a third portion spaced apart from the second portion with the first portion therebetween to extend from the first portion, wherein the bridge part may extend in the first direction.

In an exemplary embodiment, a width of the second portion in the first direction may be substantially the same as the width of each of the line parts in the second direction.

In an exemplary embodiment, the electronic apparatus may further include at least one metal pattern between the first portion and the first sensing electrode, wherein the metal pattern may be on the same layer as the trench line and may include the same (e.g., substantially the same) material as the trench line.

In an exemplary embodiment, the electronic apparatus may further include an electrostatic induction pattern overlapping the bridge part on the plane and including the same (e.g., substantially the same) material as the line parts.

In an exemplary embodiment, the electrostatic induction pattern may be connected to the bridge part.

In an exemplary embodiment, the electrostatic induction pattern may be connected to the first sensing electrode.

In an exemplary embodiment, the electronic apparatus may further include a trench part passing through the base substrate, wherein the trench part may be connected to at least one edge of the base substrate.

In an exemplary embodiment, the connection line may be between the trench part and the first sensing electrode on the plane.

In an exemplary embodiment, the electronic apparatus may further include an organic light emitting element on the base substrate and an encapsulation layer configured to cover the organic light emitting element, wherein the first sensing electrodes and the second sensing electrodes may be on the encapsulation layer in the cross-section (e.g., in the cross-sectional view).

In an exemplary embodiment of the present disclosure, an electronic apparatus includes: a first sensing electrode including a first column electrode having a first length in a first direction and a second column electrode having a length in the first direction less than the first length; a second sensing electrode including a first row electrode having a second length in a second direction different from the first direction and a second row electrode having a length in the second direction less than the second length, wherein the second row electrode includes sensing patterns spaced apart from each other in the second direction; a plurality of first sensing lines including a normal line connected to the first column electrode and a trench line connected to the second column electrode; a plurality of second sensing lines connected to the first row electrode and the second row electrode, respectively; and a connection line configured to connect the sensing patterns of the second row electrode to each other, the connection line crossing the trench line so as to be insulated from the trench line, wherein the connection line includes: a bridge part overlapping the trench line on a plane; and line parts spaced apart from each other with the trench line therebetween, the line parts being connected to each other through the bridge part, wherein the trench line is on the bridge part in a cross-section (e.g., in a cross-sectional view).

In an exemplary embodiment, the connection line may have conductivity (e.g., electrical conductivity) less than that of the trench line.

In an exemplary embodiment, the connection line may include transparent conductive oxide.

In an exemplary embodiment, the connection line may be spaced apart from the second column electrode on the plane.

In an exemplary embodiment, a width of the line part in the first direction may be substantially the same as that of the trench line in the second direction.

In an exemplary embodiment, the electronic apparatus may further include an electrostatic induction pattern on the connection line and connected to the connection line in the cross-section (e.g., in the cross-sectional view), wherein the electrostatic induction pattern may be spaced apart from the trench line on the plane.

In an exemplary embodiment, the electronic apparatus may further include an electrostatic induction pattern connected to the second column electrode on the plane, wherein the electrostatic induction pattern may be spaced apart from the trench line on the plane.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
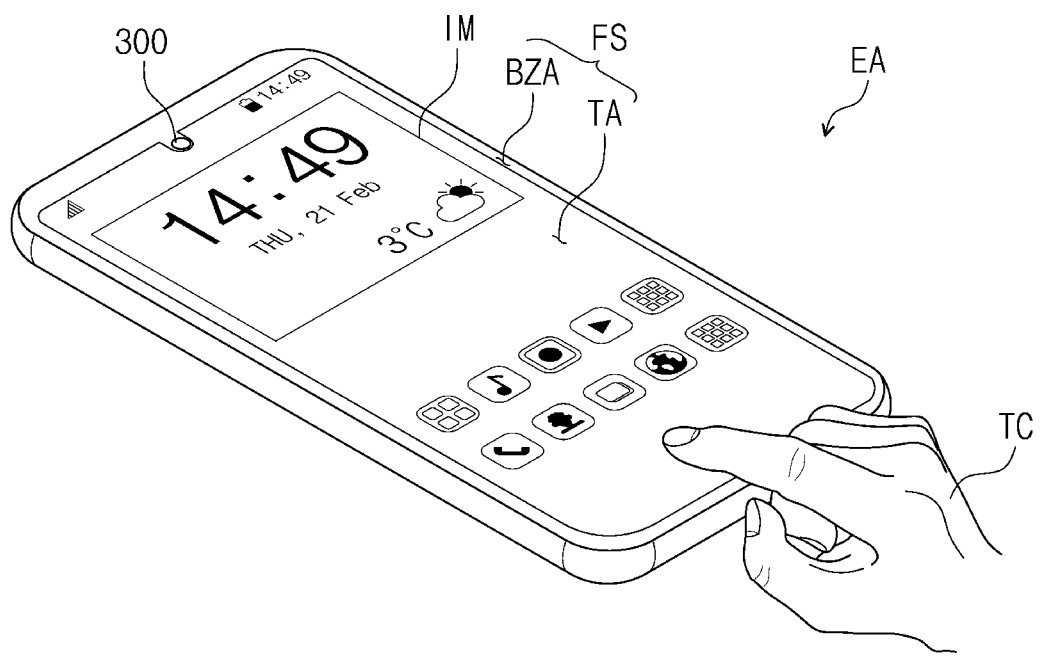
FIG. 1 is a schematic perspective view of an electronic apparatus according to an embodiment of the present disclosure.
Figure 1:
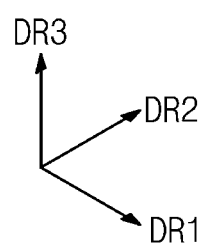

In this specification, it will also be understood that when one component (or region, layer, portion) is referred to as being "on," "connected to," or "coupled to" another component, it can be directly on, connected to, or coupled to the other component, or one or more intervening third components may also be interposed therebetween.

Like reference numerals refer to like elements throughout. Also, in the figures, the thicknesses, ratios, and dimensions of components may be exaggerated for clarity of illustration.

The term "and/or" includes any and all combinations of one or more of the associated listed items.

It will be understood that although terms such as "first" and "second" are used herein to describe various elements, these elements should not be limited by these terms. The terms are only used to distinguish one component from other components. For example, an element referred to as a first element in one embodiment can be referred to as a second element in another embodiment without departing from the scope of the appended claims. As used herein, terms in the singular form may include the plural forms as well, unless the context clearly indicates otherwise.

Also, spatially relative terms such as "under," "below," "above," "upper," and the like are used for explaining one element or feature's relationship to another element(s) or feature(s) as illustrated in the drawings. The spatially relative terms may be a relative concept and may be described based on directions illustrated in the drawings.

Unless otherwise defined, all terms (including technical and scientific terms) used herein have the same meaning as commonly understood by a person of ordinary skill in the art to which this disclosure belongs. Also, terms such as those defined in commonly used dictionaries are to be interpreted as having a meaning consistent with their meaning in the context of the relevant art and/or the present specification, and should not be interpreted in an idealized or overly formal sense, unless expressly so defined herein.

The terms "include" and "comprise" specify the presence of a property, a fixed number, a step, an operation, an element, a component and/or a combination thereof, but do not preclude the presence or addition of one or more other properties, fixed numbers, steps, operations, elements, components and/or combinations thereof.

Hereinafter, embodiments of the present disclosure will be described with reference to the accompanying drawings.

Figure 2:
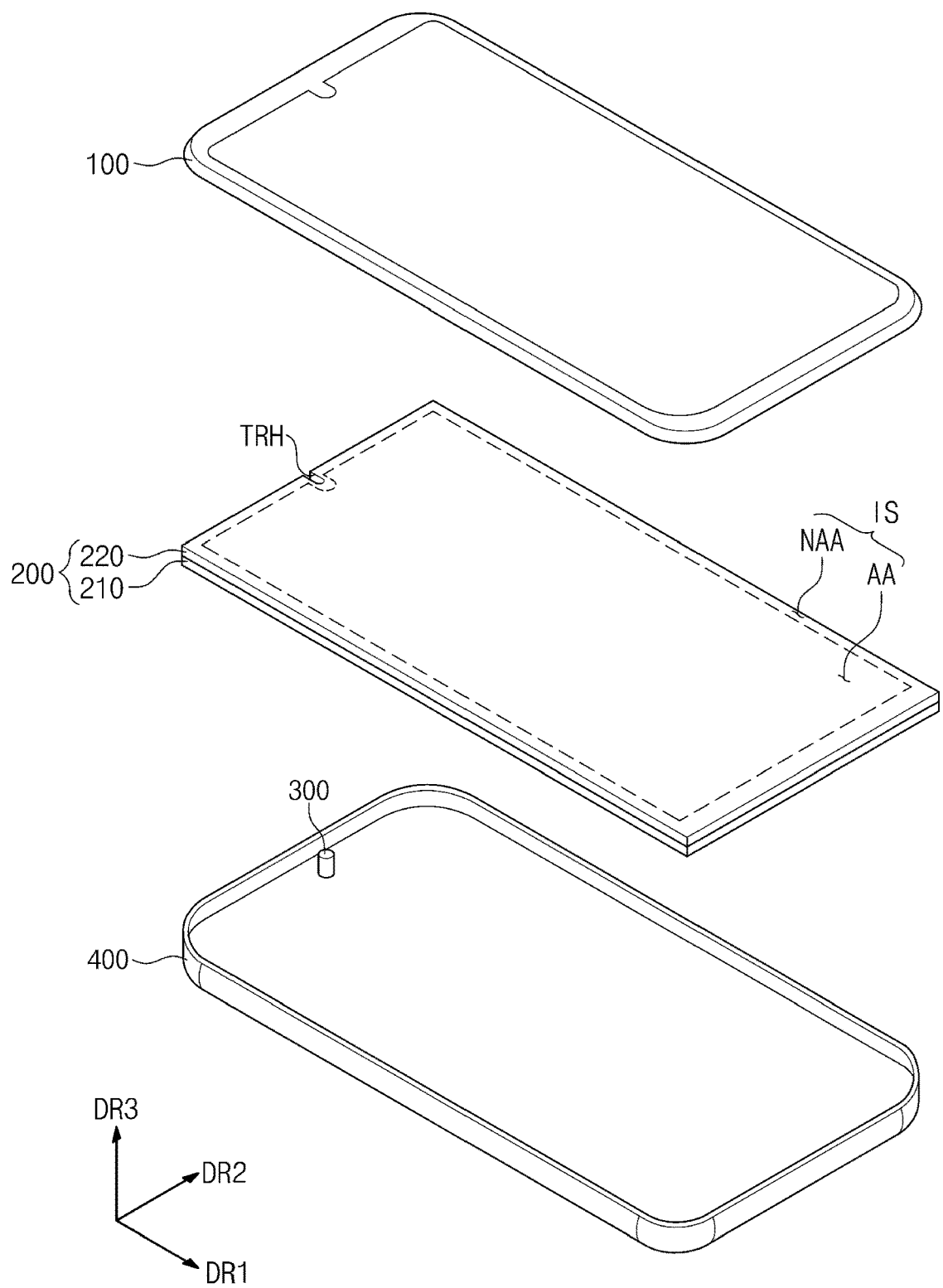
FIG. 2 is an exploded perspective view of the electronic apparatus of FIG. 1.
Figure 3:
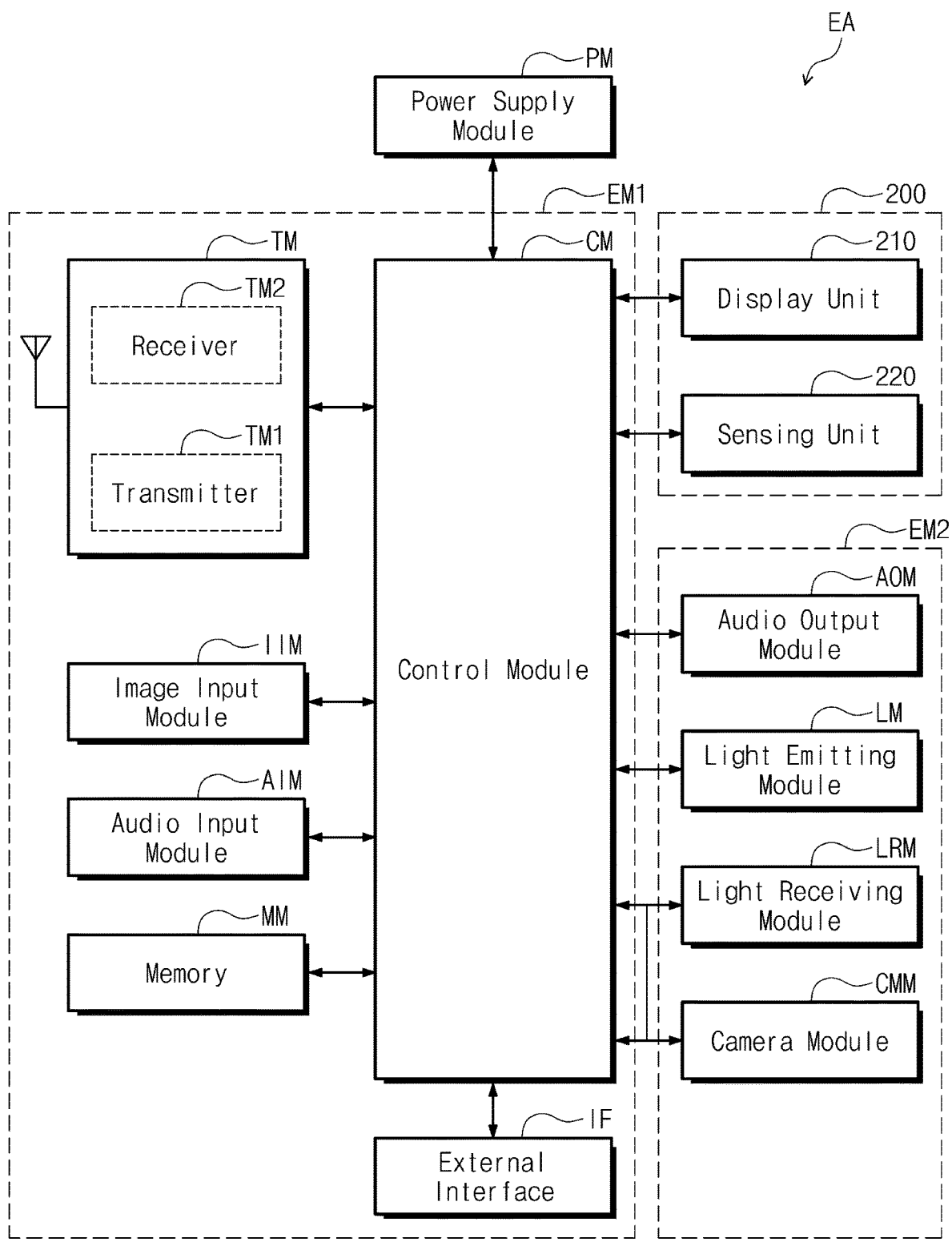
FIG. 3 is a block diagram of the electronic apparatus of FIG. 1.

FIG. 1 is a schematic perspective view of an electronic apparatus according to an embodiment of the present disclosure. FIG. 2 is an exploded perspective view of the electronic apparatus of FIG. 1. FIG. 3 is a block diagram of the electronic apparatus of FIG. 1. Hereinafter, some embodiments of the present disclosure will be described with reference to FIGS. 1 to 3.

An electronic apparatus EA may be an apparatus that is activated according to (e.g., activated by or operated according to) an electrical signal. The electronic apparatus EA may include (e.g., may take the form of) various examples. Examples of the electronic apparatus EA may include a tablet, a notebook, a computer, a smart television, and/or the like. In the embodiment illustrated in FIG. 1, the electronic apparatus EA includes (e.g., is) a smart phone, and this embodiment will be described as an example. However, the present disclosure is not limited thereto.

Referring to FIG. 1, an electronic apparatus EA may display an image IM through a front surface FS. The front surface FS may be parallel (e.g., substantially parallel) to a surface (e.g., a plane) defined by a first direction DR1 and a second direction DR2. The front surface FS may include a transmission area TA and a bezel area BZA adjacent to the transmission area TA.

The electronic apparatus EA displays the image IM on (e.g., through) the transmission area TA. The image IM may include at least one selected from a static image and a moving image. In FIG. 1, the image IM is illustrated to be a watch and a plurality of icons as an example.

The transmission area TA may have a rectangular shape that is parallel (e.g., substantially parallel) to the first direction DR1 and the second direction DR2 (e.g., to the plane defined by the first direction DR1 and the second direction DR2). For example, when the transmission area TA has a rectangular shape, the long sides of the transmission area TA may be parallel (e.g., substantially parallel) to the first direction DR1, and the short sides of the transmission area TA may be parallel (e.g., substantially parallel) to the second direction DR2. However, the present disclose is not limited thereto. For example, each of the electronic apparatus EA and the transmission area TA may have various suitable shapes.

The bezel area BZA is adjacent to the transmission area TA. The bezel area BZA may surround the transmission area TA. However, the present disclosure is not limited thereto. For example, the bezel area BZA may be adjacent to only one side of the transmission area TA or may be omitted. The electronic apparatus EA may include various suitable embodiments.

A normal direction of the front surface FS (e.g., a direction normal to or perpendicular to the front surface FS) may correspond to a thickness direction (hereinafter, referred to as a third direction DR3) of the electronic apparatus EA. In some embodiments, a front surface (or a top surface) and/or a rear surface (or a bottom surface) of each of the members (e.g., components and/or features of the electronic apparatus EA) may be defined based on a direction in which the image IM is displayed. The front and rear surfaces may be opposite to each other in the third direction DR3. The directions indicated as the first to third direction DR1, DR2, and DR3 may be a relative concept and thus may be changed into different directions. Hereinafter, the first to third directions may be directions indicated by the first to third directions DR1, DR2, and DR3 and may be designated by the same reference numerals, respectively.

The electronic apparatus EA according to some embodiments of the present disclosure may sense a user's input TC applied from the outside. The user's input TC may include various types or kinds of external inputs such as a portion of the user's body, light, and/or heat; a pressure; and/or the like. Also, the electronic apparatus EA may sense not only an input contacting (e.g., directly or physically contacting) the electronic apparatus EA but also an approaching or adjacent input.

In some embodiments, the user's input TC is illustrated as the user's hand (e.g., the user's fingertip) applied to (e.g., physically contacting or hovering over) the front surface FS. However, the present disclosure is not limited thereto. For example, as described herein above, the user's input TC may be provided in various suitable forms or shapes. The electronic apparatus EA may sense the user's input TC applied to a side surface or the rear surface of the electronic apparatus EA according to a structure of the electronic apparatus EA, but the present disclosure is not limited thereto.

The electronic apparatus EA may include a window 100, an electronic panel 200, an electronic module 300, and an external case 400. The window 100 and the external case 400 may be coupled to each other to define an outer appearance of the electronic apparatus EA. In some embodiments, the electronic apparatus EA may include a base substrate. In some embodiments, the base substrate may be included in the electronic panel 200.

The window 100 may be on the electronic panel 200 to cover the front surface IS of the electronic panel 200. The window 100 may include an optically transparent insulation material. For example, the window 100 may include glass and/or plastic. The window 100 may have a single layer or a multilayered structure. For example, the window 100 may have a laminated structure of a plurality of plastic films bonded to each other by adhesives or a laminated structure of a glass substrate and a plastic film, which are bonded to each other by an adhesive.

The transmission area TA and the bezel area BZA may be areas on the window 100. For example, the transmission area TA may be an optically transparent area. The transmission area TA may have a shape corresponding to that of an active area AA of the electronic panel 200. For example, the transmission area TA may overlap an entire surface of at least a portion of the active area AA. For example, in some embodiments, the transmission area TA overlaps a portion or all of the active area AA. The image IM displayed on (e.g., displayed by or displayed from) the active area AA of the electronic panel 200 may be visible through the transmission area TA from the outside.

The bezel area BZA may be an area having light transmittance (e.g., light transparency) that is relatively less than that of the transmission area TA. The bezel area BZA may define a shape of the transmission area TA. The bezel area BZA may be adjacent to the transmission area TA to surround the transmission area TA.

The bezel area BZA may have a set or predetermined color. When the window 100 is a glass and/or plastic substrate, the bezel area BZA may be a color layer that is printed or deposited on one surface (e.g., an outer surface) of the glass or plastic substrate. In some embodiments, the bezel area BZA may be formed by coloring a corresponding area of the glass or plastic substrate.

The bezel area BZA may cover a peripheral area NAA of the electronic panel 200 to prevent or reduce the visibility of the peripheral area NAA from the outside. However, the present disclosure is not limited thereto. For example, in some embodiments the bezel area BZA may be omitted from the window 100.

The electronic panel 200 may display the image IM and sense an external input TC. The electronic panel 200 includes the front surface IS including an active area AA and a peripheral area NAA. The active area AA may be an area that is activated according to (e.g., activated by or operated according to) an electrical signal.

In some embodiments, the active area AA may be an area on which (e.g., from which) the image IM is displayed, and on which the external input TC may be sensed. The transmission area TA overlaps at least active area AA. For example, the transmission area TA overlaps an entire surface of at least a portion of the active area AA. Thus, the user may see the image IM through the transmission area TA or may provide the external input TC through the transmission area TA. However, the present disclosure is not limited thereto.

For example, in some embodiments, an area of the active area AA, on which the image IM is displayed, and an area of the active area AA, on which the external input TC is sensed, may be separated from each other.

The peripheral area NAA may be an area covered by the bezel area BZA. The peripheral area NAA is adjacent to the active area AA. The peripheral area NAA may surround the active area AA. A driving circuit or a driving line for driving the active area AA may be in the peripheral area NAA.

Various signal lines that may provide an electrical signal to the active area AA, pads PD, or electronic elements may be in the peripheral area NAA. The peripheral area NAA may be covered by the bezel area BZA and thus may not be visible from the outside.

In some embodiments, the electronic panel 200 may be assembled so that the active area AA and the peripheral area NAA are flat and face the window 100. However, the present disclosure is not limited thereto. For example, a portion of the peripheral area NAA of the electronic panel 200 may be bent. For example, a portion of the peripheral area NAA may face a rear surface (e.g., a bottom surface) of the electronic apparatus EA to reduce an area of the bezel BZA on the front surface (e.g., the top surface) of the electronic apparatus EA. In some embodiments, the electronic panel 200 may be assembled so that a portion of the active area AA is bent. In some embodiments, the peripheral area NAA may be omitted from the electronic panel 200.

Referring to FIG. 2, the electronic panel 200 may include a display unit 210 and a sensing unit 220. The display unit 210 may be a constituent that generates (e.g., substantially generates) the image IM. The image IM generated by the display unit 210 may be visible from the outside by the user through the transmission area TA. In some embodiments, the display unit 210 comprises a base substrate and an organic light emitting element on the base substrate. The display unit 210 comprises an encapsulation layer covering the organic light emitting element. In some embodiments, the sensing unit 220 is on the display unit 210. In some embodiments, an encapsulation layer is between the display unit 210 and the sensing unit 220. The sensing unit 220 is on the encapsulation layer. In some embodiments, the first sensing electrodes and the second sensing electrodes are on the encapsulation layer in a cross-section.

The sensing unit 220 senses the external input TC applied from the outside. As described herein above, the sensing unit 220 may sense the external input TC provided to (e.g., provided on) the window 100.

A set or predetermined trench part TRH may be in the electronic panel 200. The trench part TRH may pass through at least one selected from the display unit 210 and the sensing unit 220. The trench part TRH may be connected to at least one selected from edges of the electronic panel 200. In some embodiments, the trench part TRH may pass through all of the display unit 210 and the sensing unit 220 (e.g., through all of the electronic panel 200).

The active area AA may surround at least a portion of the trench part TRH. The active area AA may have a shape that is partially recessed from a plane along an edge of the trench part TRH due to the trench part TRH. For example, in some embodiments, a portion of a side of the active area AA at which the trench part TRH is located may be recessed away from the side of the active area AA because of the trench part TRH.

The electronic module 300 is below the window 100. The electronic module 300 may overlap the trench part TRH.

The electronic module 300 may be on the rear surface of the electronic panel 200. According to embodiments of the present disclosure, the electronic module 300 may overlap the active area AA, thereby preventing or reducing an increase to the bezel area BZA.

Referring to FIG. 3, the electronic apparatus EA may include an electronic panel 200, a power supply module PM, a first electronic module EM1, and a second electronic module EM2. The electronic panel 200, the power supply module PM, the first electronic module EM1, and the second electronic module EM2 may be electrically connected to each other. In FIG. 2, the display unit 210 and the sensing unit 220 of the electronic panel 200 are illustrated as an example.

The first electronic module EM1 and the second electronic module EM2 may include various functional modules for driving the electronic apparatus EA. The first electronic module EM1 may be directly mounted on a mother board electrically connected to the electronic panel 200 or may be mounted on a separate board and electrically connected to the mother board through a connector.

The first electronic module EM1 may include a control module CM, a wireless communication module TM, an image input module IIM, an audio input module AIM, a memory MM, and an external interface IF. A portion of the modules (e.g., a portion of, or some of, the modules of the first electronic module EM1) may not be mounted on the mother board but may be electrically connected to the mother board through a flexible circuit board.

The control module CM controls the overall operation of the electronic apparatus EA. The control module CM may be a microprocessor. For example, the control module CM may activate or inactivate the electronic panel 200. The control module CM may control other modules such as the image input module IIM or the audio input module AIM on the basis of (e.g., based on or in accordance to) a touch signal received from the electronic panel 200.

The wireless communication module TM may transmit and/or receive a wireless signal to and/or from the other electronic apparatus by using Bluetooth and/or a Wi-Fi line. The wireless communication module TM may transmit and/or receive an audio signal by using (e.g., through) a general communication line. The wireless communication module TM includes a transmitter TM1 to modulate and transmit a signal to be transmitted and a receiver TM2 to demodulate a received signal.

The image input module IIM processes an image signal to convert the image signal into image data that is capable of being displayed (e.g., capable of being utilized to display an image) on the electronic panel 200. The audio input module AIM receives external audio signals by using a microphone during a recording mode or during a voice recognition mode and converts the received audio signals into electrical sound data.

The external interface IF serves as an interface connected to an external charger, a wired/wireless data port, a card socket (for example, a memory card and/or an SIM/UIM card), and/or the like.

The second electronic module EM2 may include an audio output module AOM, a light emitting module LM, a light receiving module LRM, and a camera module CMM. The above-described constituents (e.g., the above-described modules of the second electronic module EM2) may be directly mounted on the mother board, may be mounted on a separate board and electrically connected to the electronic panel 200 through a connector, or may be electrically connected to the first electronic module EM1.

The audio output module AOM converts audio data received from the wireless communication module TM or audio data stored in the memory MM (e.g., audio data stored in the memory MM and received by the audio output module AOM) and outputs the converted audio data to the outside.

The light emitting module LM generates and outputs light. The light emitting module LM may output infrared rays. For example, the light emitting module LM may include an LED element. In some embodiments, the light receiving module LRM may sense infrared rays. The light receiving module LRM may be activated when infrared rays having a set or predetermined level (e.g., a set or predetermined energy or intensity) or more are sensed. The light receiving module LRM may include a complementary metal oxide semiconductor (CMOS) sensor. The infrared rays generated by the light emitting module LM may be outputted and then may be reflected by an external object (e.g., a user's finger or face), and the reflected infrared rays may be incident onto the light receiving module LRM. The camera module CMM photographs an external image.

The electronic module 300 according to an embodiment of the present disclosure may include at least one constituent selected from the constituents of the first electronic module EM1 and the second electronic module EM2. For example, the electronic module 300 may include at least one selected from a camera, a speaker, an optical detection sensor, and a thermal detection sensor. The electronic module 300 may sense an external object received through the trench part TRH (e.g., signals from the external object received through the trench part TRH). In some embodiments, the electronic module 300 may include a plurality of constituents, and the plurality of constituents may include any suitable combination of constituents.

In the electronic module 300 overlapping the trench part TRH, the external object may be easily visible through the trench part TRH, or an output signal generated by the electronic module 300 may be easily transmitted to the outside.

The electronic apparatus EA according to an embodiment of the present disclosure may include a transparent member between the electronic module 300 and the electronic panel 200. The transparent member may be attached (e.g., attached by an adhesion layer) to the rear surface of the electronic panel 200 or may be between the electronic panel 200 and the electronic module 300 without an adhesion layer. The electronic apparatus EA according to some embodiments of the present disclosure is not limited to a specific embodiment and may have various suitable shapes According to embodiments of the present disclosure, the electronic module 300 may overlap the transmission area TA on the plane. Thus, because the electronic module 300 is located so as not to overlap the electronic panel 200, an increase of the bezel area BZA may be prevented or reduced to improve aesthetics of the electronic apparatus EA.

Figure 4:
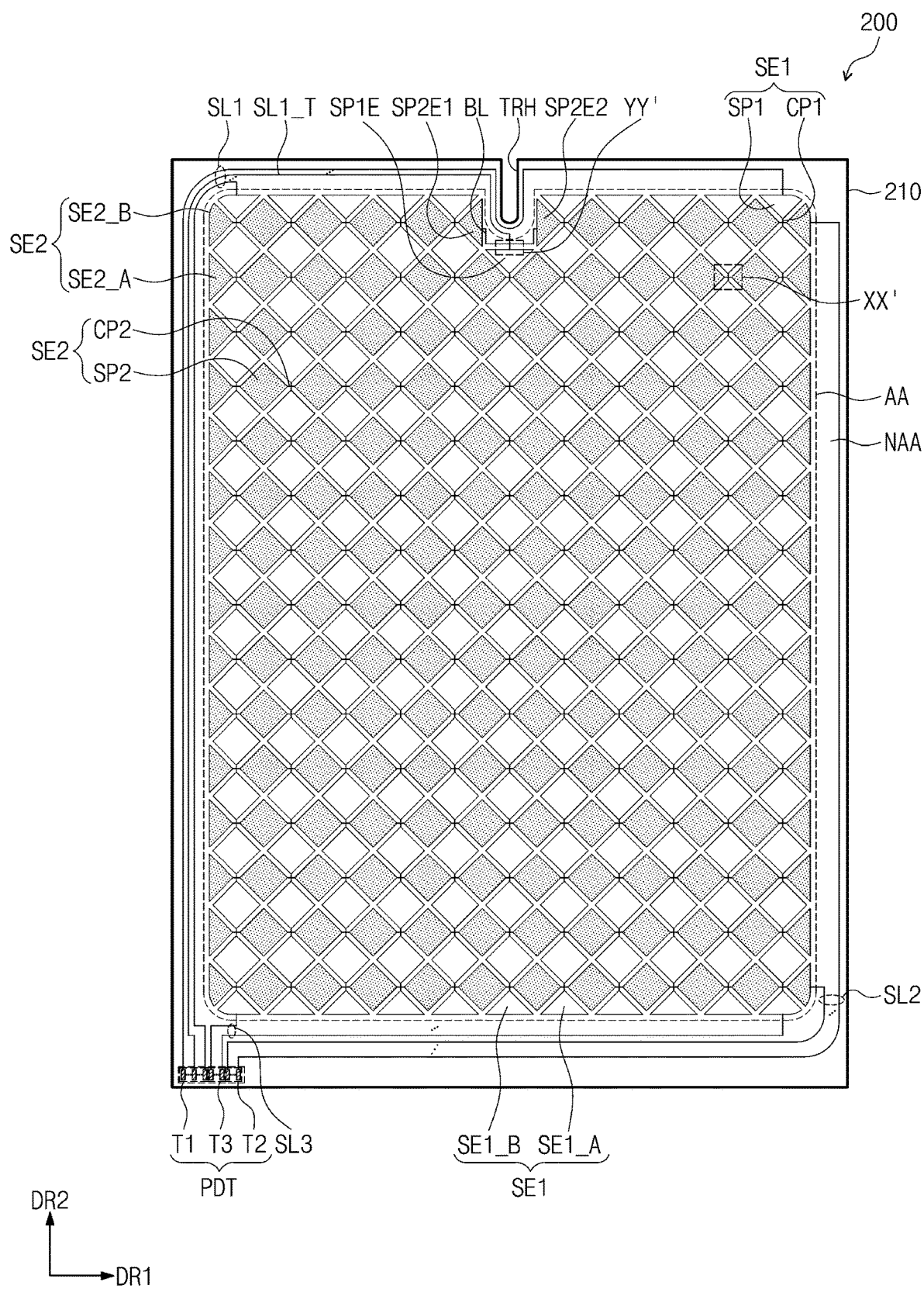
FIG. 4 is a plan view illustrating a portion of an electronic panel according to an embodiment of the present disclosure.
Figure 5A:
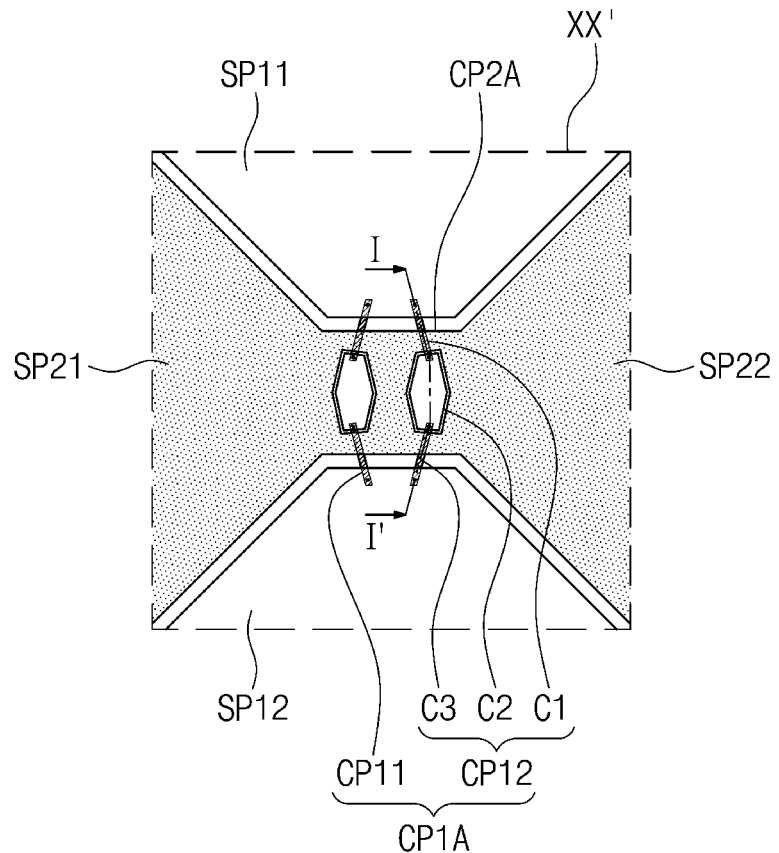
FIG. 5A is a plan view of an area XX' of FIG. 4.
Figure 5B:
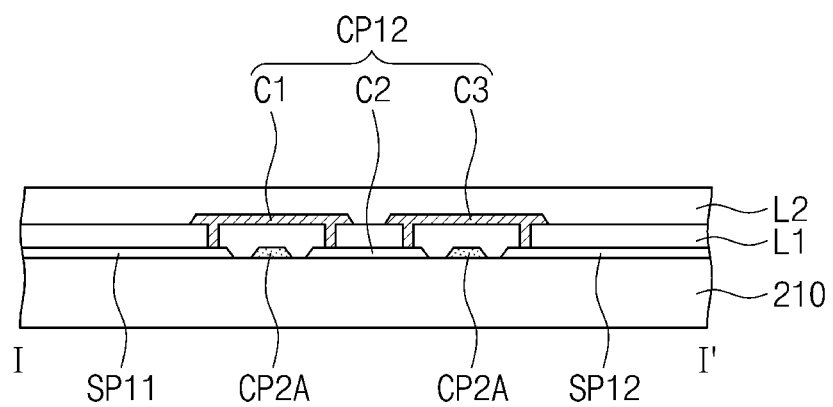
FIG. 5B is a cross-sectional view taken along line I-I' of FIG. 5A.

FIG. 4 is a plan view illustrating a portion of the electronic panel according to some embodiments of the present disclosure. FIG. 5A is a plan view of an area XX' of FIG. 4. FIG. 5B is a cross-sectional view taken along line I-I' of FIG. 5A. Hereinafter, some embodiments of the present disclosure will be described with reference to FIGS. 4 to 5B. The same reference numerals may be given to the same components as those of FIGS. 1 to 3, and duplicative descriptions thereof will not be repeated here.

In FIG. 4, for convenience of description, constituents of the sensing unit 220 on the display unit 210 are illustrated. As illustrated in FIG. 4, the sensing unit 220 may include a plurality of first sensing electrodes SE1, a plurality of second sensing electrodes SE2, a plurality of first sensing lines SL1, a plurality of second sensing lines SL2, a plurality of third sensing lines SL3, and a plurality of sensing pads PDT.

The first sensing electrodes SE1 may be arranged to be spaced apart from each other in the first direction DR1 and may extend in the second direction DR2. Each of the first sensing electrodes SE1 may include a plurality of first sensing patterns SP1 and a plurality of first connection patterns CP1, which are arranged in the second direction DR2.

The first sensing patterns SP1 and the first connection patterns CP1 may be alternately arranged in the second direction DR2. The first sensing patterns SP1 may be arranged in the second direction DR2, and the first connection patterns CP1 may be between the first sensing patterns SP1. Each of the first connection patterns CP1 may connect two adjacent first sensing patterns SP1 (e.g., two of the first sensing patterns SP1 that are adjacent in the second direction DR2) to each other.

The second sensing electrodes SE2 may be arranged to be spaced apart from each other in the second direction DR2 and may extend in the first direction DR1. Each of the second sensing electrodes SE2 may include a plurality of second sensing patterns SP2 and a plurality of second connection patterns CP2, which are arranged in the first direction DR1. The second sensing patterns SP2 and the second connection patterns CP2 may be alternately arranged in the first direction DR1. Each of the second connection patterns CP2 connects two adjacent second sensing patterns SP2 (e.g., two of the second sensing patterns SP2 that are adjacent in the first direction DR1) to each other.

In some embodiments, the first connection patterns CP1 and the second connection patterns CP2 may be on layers that are different from each other, and the first sensing patterns SP1 and the second sensing patterns SP2 may be on the same layer. Hereinafter, for convenience of description, some embodiments in which the first connection patterns CP1 are on a layer different from that on which the second connection patterns CP2, the first sensing patterns SP1, and the second sensing patterns SP2 are on will be described. However, the present disclosure is not limited thereto. For example, in some embodiments, the first connection patterns CP1 may be on the same layer as the first sensing patterns SP1 and the second sensing patterns SP2, or the first connection patterns CP1 and the first sensing patterns SP1 may be on a layer different from that on which the second connection patterns CP2 and the second sensing patterns SP2 are on.

As illustrated in FIGS. 5A and 5B, the two adjacent first sensing patterns SP11 and SP12 of the first sensing patterns SP1 are connected to each other through a first connection pattern CP1A. The first sensing patterns SP11 and SP12 are between the display unit 210 and a first layer L1.

In some embodiments, the first connection pattern CP1A may include a plurality of patterns CP11 and CP12, which are spaced apart from each other. Each of the patterns CP11 and CP12 may include a first portion C1, a second portion C2, and a third portion C3.

The first portion C1 extends to cross the first sensing pattern SP11 and the second connection pattern CP2A. The first portion C1 overlaps the first sensing pattern SP11 and a second connection pattern CP2A on the plane.

The first portion C1 is on a layer different from that on which the first sensing pattern SP11 and the second connection pattern CP2A are on. In this embodiment, the first portion C1 may be between a first layer L1 and a second layer L2 so as to be electrically insulated from the first sensing patterns SP11 and the second connection pattern CP2A.

The second portion C2 may be on a layer different from that on which the first portion C1 is on, and the second portion C2 may be on the same layer as the second sensing patterns SP21 and SP22 and the second connection pattern CP2A. The second portion C2 may be between the display unit 210 and the first layer L1 and may also be spaced apart from the second sensing patterns SP21 and SP22 and the second connection pattern CP2A on the plane. In some embodiments, the second portion C2 may be within an opening defined in the second connection pattern CP2A.

The third portion C3 is spaced apart from the first portion C1 to extend so as to cross the first sensing pattern SP12 and the second connection pattern CP2A. The third portion C3 overlaps the first sensing pattern SP12 and the second connection pattern CP2A on the plane. The third portion C3 is on the same layer as the first portion C1. The first portion C1 and the third portion C3 may pass through the first layer L1 and be connected to the first sensing patterns SP11 and SP12, respectively. The first portion C1 and the third portion C3 may pass through the first layer L1 and be connected to the second portion C2. For example, in some embodiments, the first portion C1 may connect (e.g., electrically connect) the first sensing portion SP11 to the second portion C2, and the third portion C3 may connect (e.g., electrically connect) the second portion C2 to the first sensing portion SP12. Thus, the first, second, and third portions C1, C2, and C3 may connect (e.g., electrically connect) the first sensing patterns SP11 and SP12 to each other.

However, the present disclosure is not limited thereto. For example, in some embodiments, the second portion C2 may be omitted from the sensing unit 220, and the first portion C1 and the third portion C3 may be directly connected to each other. In some embodiments, the patterns CP11 and CP12 may have structures that are different from each other, but the present disclosure is not limited thereto. For example, in some embodiments, the patterns CP11 and CP12 may have the same structure.

The second connection pattern CP2A from among the second connection patterns CP2, which crosses the first connection pattern CP1A, connects (e.g., electrically connects) two adjacent second sensing patterns SP21 and SP22 (e.g., two second sensing patterns SP21 and SP22 adjacent in the first direction DR1) of the second sensing patterns SP2. The second connection pattern CP2A may be on the same layer as the second sensing patterns SP21 and SP22 and may cross the first connection pattern CP1A so that the first and second connection patterns CP1A and CP2A are insulated from each other. In some embodiments, the second sensing patterns SP21 and the SP22 may be integrated with the second connection pattern CP2A.

Referring again to FIG. 4, the first sensing electrodes SE1 may include a plurality of first column electrodes SE1_A and at least one second column electrode SE1-B. The first column electrodes SE1_A may be electrodes on an area that does not overlap the trench part TRH in the second direction DR2. For example, in some embodiments, each of the first column electrodes SE1_A may extend along a line in the second direction DR2 that does not cross the trench part TRH.

The second column electrode SE1_B may overlap the trench part TRH in the second direction DR2. For example, in some embodiments, the second column electrodes SE1_B may extend along a line in the second direction DR2 that crosses the trench part TRH. A length of the second column electrode SE1_B in the second direction DR2 is less than that of a length of each of the first column electrodes SE1_A in the second direction DR2.

The second sensing electrodes SE2 may include a plurality of second row electrodes SE2_A and at least one second row electrode SE2-B. The second row electrodes SE2_A may be electrodes on an area that does not overlap the trench part TRH in the first direction DR1. For example, in some embodiments, each of the second row electrodes SE2_A may extend along a line in the first direction DR1 that does not overlap the trench part TRH.

The second row electrode SE2_B may overlap the trench part TRH in the first direction DR1. For example, in some embodiments, the second row electrode SE2_B may extend along a line in the first direction DR1 that overlaps the trench part TRH. The second row electrode SE2_B may be divided into two portions that are spaced apart from each other in the first direction DR1 with the trench part TRH therebetween. The two portions of the second row electrodes SE2_B, which are separated from each other by the trench part TRH, may be connected to each other through a connection line BL. In some embodiments, the connection line BL connects two second sensing patterns SP2E1 and SP2E2, which face the trench part TRH, of the two portions of the second row electrode SE2_B to each other. However, the present disclosure is not limited thereto. For example, the second row electrode SE2_B may have various suitable shapes according to the position of the trench part TRH.

The sensing lines SL1, SL2, and SL3 and the sensing pads PDT are in the peripheral area NAA. The sensing pads PDT are connected to the sensing lines SL1, SL2, and SL3. The sensing lines SL1, SL2, and SL3 include a plurality of first sensing lines SL1, a plurality of second sensing lines SL2, and a plurality of third sensing lines SL3. In some embodiments, the sensing pads PDT may include first pads T1, second pads T2, and third pads T3. For example, in some embodiments, the first, second, and third pads T1, T2, and T3 are connected to the first, second, and third sensing lines SL1, SL2, and SL3, respectively.

The first sensing lines SL1 are connected to ends (e.g., first ends) of the first sensing electrodes SE1, respectively. The first sensing lines SL1 connect first pads T1 of the sensing pads PDT to the first sensing electrodes SE1 to transmit electrical signals provided from the outside (e.g., from outside the sensing unit 220) to the first sensing electrodes SE1, respectively.

The second sensing lines SL2 are connected to ends of the second sensing electrodes SE2, respectively. The second sensing lines SL2 connect second pads T2 of the sensing pads PDT to the second sensing electrodes SE2 to transmit electrical signals provided from the outside (e.g., from outside the sensing unit 220) to the second sensing electrodes SE2, respectively.

The third sensing lines SL3 are connected to other ends (e.g., second ends) of the first sensing electrodes SE1, respectively. The other ends (e.g., the second ends) of the first sensing electrodes SE1 may be portions (e.g., end portions of the first sensing electrodes SE1) that are opposite to the ends (e.g., first ends) of the first sensing electrodes SE1. According to embodiments of the present disclosure, the first sensing electrodes SE1 may be connected to the first sensing lines SL1 and the third sensing lines SL3. Thus, the sensitivity on the area with respect to (e.g., corresponding to) the first sensing electrodes SE1, each of which has a length that is relatively longer than that of each of the second sensing electrodes SE2, may be uniformly (e.g., substantially uniformly) maintained.

The first sensing lines SL1 according to an embodiment of the present disclosure may include a trench line SL1_T. The trench line SL1_T may be connected to the second column electrode SE1_B of the first sensing electrodes SE1. The trench line SL1_T is connected to the first sensing pattern SP1E, which faces the trench part TRH, of the second column electrode SE1_B.

The trench line SL1_T may overlap the connection line BL on the plane. The trench line SL1_T may cross the connection line BL so as to be insulated from the connection line BL. Thus, the trench line SL1_T and the connection line BL may transmit independent electrical signals to maintain the uniform (e.g., substantially uniform) sensitivity even on the area adjacent to the trench part TRH (e.g., the area corresponding to the second column electrode SE1_B) and prevent or reduce an occurrence of an electrical short-circuit of the first sensing electrodes SE1 and the second sensing electrodes SE2 with each other.

Figure 6:
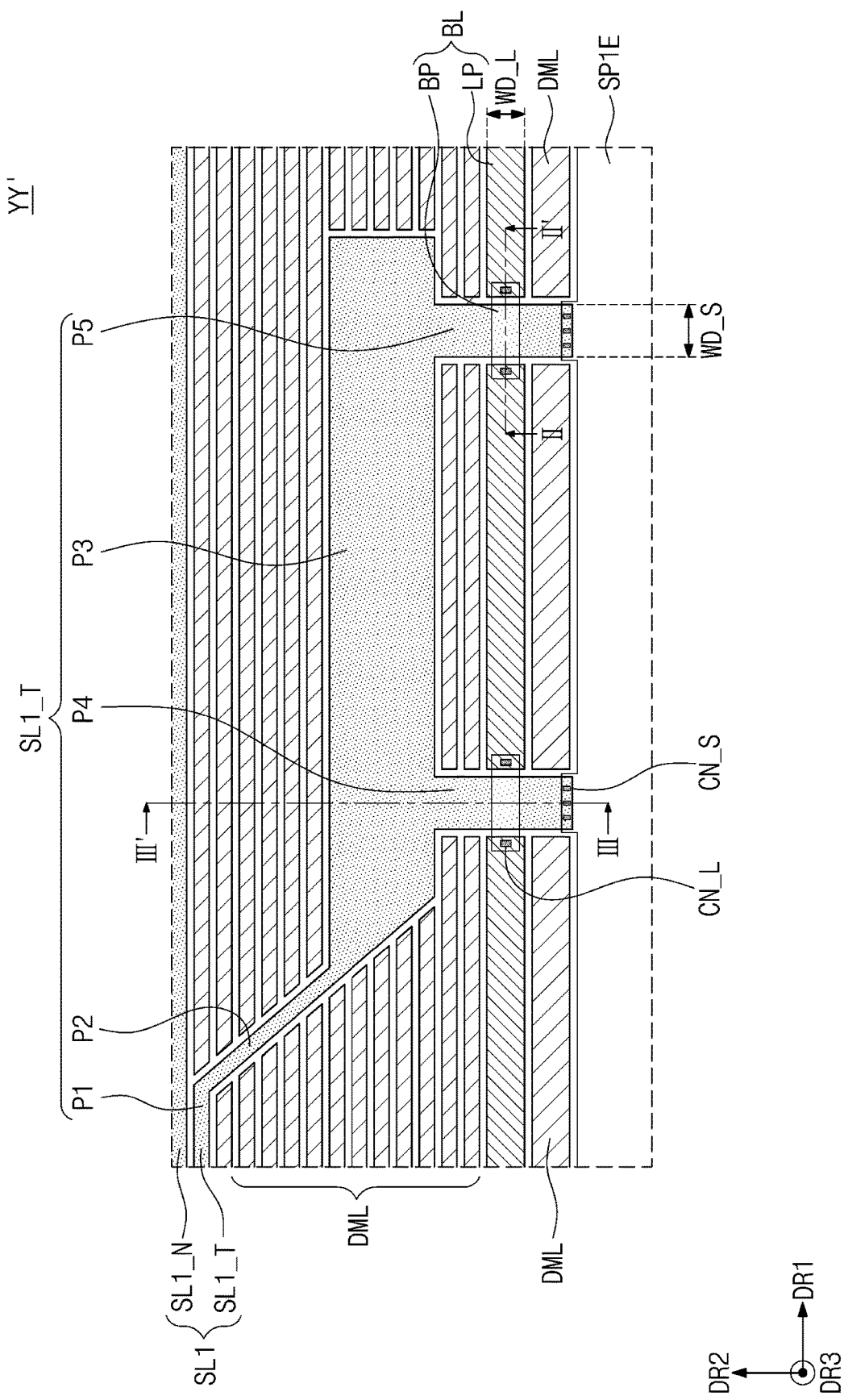
FIG. 6 is a plan view illustrating an area YY' of FIG. 4.
Figure 7A:
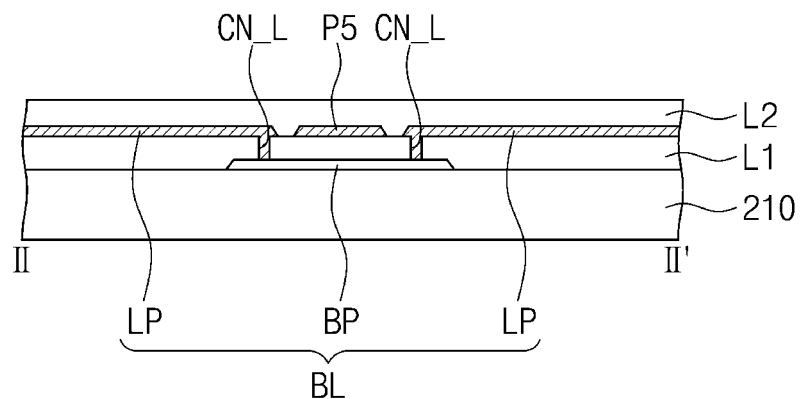
FIG. 7A is a cross-sectional view taken along line II-II' of FIG. 6.
Figure 7B:
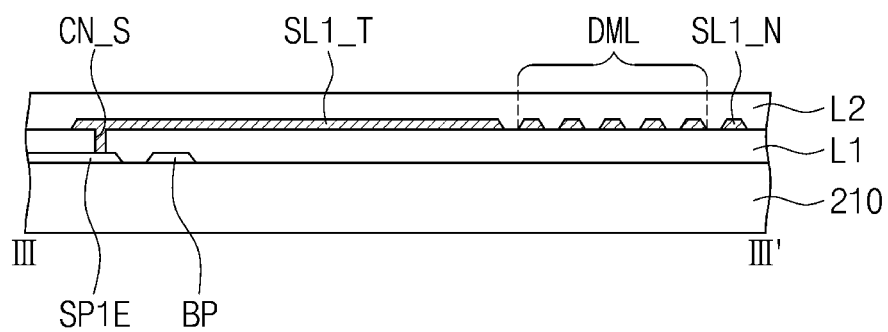
FIG. 7B is a cross-sectional view taken along line III-III' of FIG. 6.
Figure 8A:
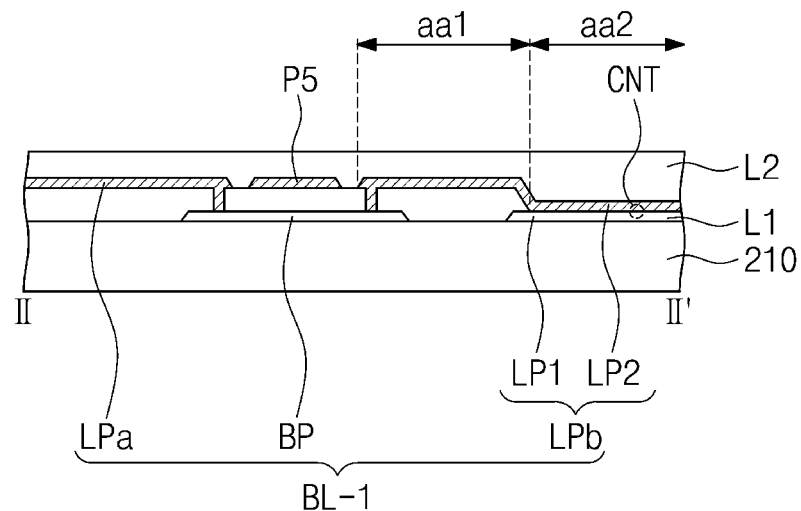
FIGS. 8A and 8B are cross-sectional views illustrating portions of the electronic panel according to an embodiment of the present disclosure.
Figure 8B:
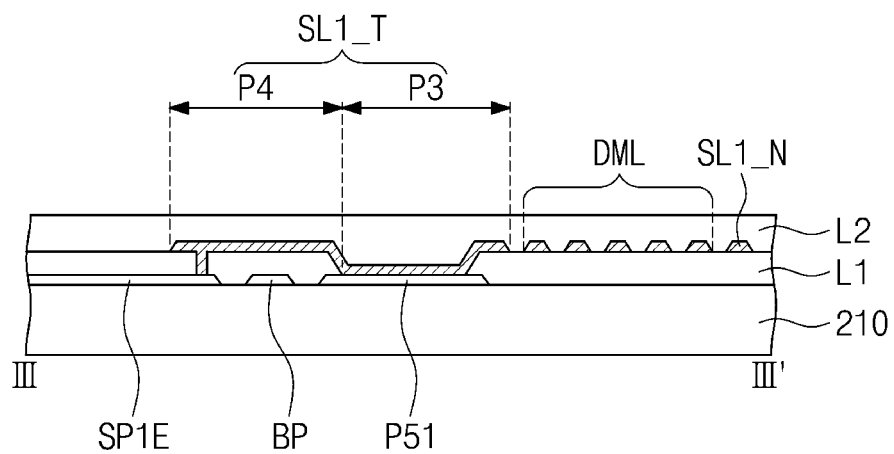

FIG. 6 is a plan view illustrating an area YY' of FIG. 4. FIG. 7A is a cross-sectional view taken along line II-II' of FIG. 6, and FIG. 7B is a cross-sectional view taken along line III-III' of FIG. 6. Each of FIGS. 8A and 8B is a cross-sectional view illustrating portions of the electronic panel according to an embodiment of the present disclosure. FIG. 8A illustrates an area corresponding to FIG. 7A, and FIG. 8B illustrates an area corresponding to FIG. 7B. Hereinafter, some embodiments of the present disclosure will be described with reference to FIGS. 6 to 8B. The same reference numerals may be given to the same components as those of FIGS. 1 to 5B, and duplicative descriptions thereof will not be repeated here.

FIG. 6 illustrates an enlarged view of an area in which the trench line SL1_T and the connection line BL cross each other. The first sensing lines SL1 may include the trench line SL1_T and a normal line SL1_N. The normal line SL1_N may be provided in plurality. The plurality of normal lines SL1_N may be connected to ends (e.g., to the first ends) of the first column electrodes SE1_A (see FIG. 4) of the first sensing electrodes SE1 (see FIG. 4), respectively.

The trench line SL1_T is connected to the first sensing pattern SP1E, which faces the trench part TRH, of the second column electrode SE1_B (see FIG. 4). The trench line SL1_T may include first to fifth portions P1, P2, P3, P4, and P5, which are connected to each other to form one body.

The first portion P1 may be a portion of the trench line SL1_T, which is most adjacent to the normal lines SL1_N to extend in parallel (e.g., substantially in parallel) to the normal line SL1_N. In some embodiments, the first portion P1 may extend in parallel (e.g., substantially in parallel) to the normal line SL1_N and may be closer to the normal line SL1_N than the second to fifth portions P2, P3, P4, and P5. The second portion P2 is bent from the first portion P1 to extend toward the first sensing pattern SP1E.

The third portion P3 may be bent from the second portion P2 to extend in parallel (e.g., substantially in parallel) to the connection line BL. An embodiment in which the third portion P3 has a width that is relatively larger than that of each of the first portion P1 and the second portion P2 is described.

Each of the fourth portion P4 and the fifth portion P5 may be a portion that extends from the third portion P3 and is connected to the first sensing pattern SP1E. The fourth portion P4 and the fifth portion P5 overlap the first sensing pattern SP1E on the plane. Each of the fourth portion P4 and the fifth portion P5 may be connected to the first sensing pattern SP1E through set or predetermined contact holes CN_S.

The first to fifth portions P1, P2, P3, P4, and P5 may be connected to each other to form one body. The trench line SL1_T may include a metal having high conductivity (e.g., high electrical conductivity). For example, the trench line SL1_T may include silver, gold, copper, aluminum, and/or molybdenum. The trench line SL1_T may be on the same layer as the connection patterns BP and may include the same (e.g., substantially the same) material as the connection patterns BP.

The connection line BL overlaps the trench line SL1_T on the plane. The connection line BL may include a line part LP and a bridge part BP. The line part LP may be provided in plurality. In some embodiments, the bridge part BP may include a plurality of bridge parts. The plurality of line parts LP may be spaced apart from each other. The line part LP may not overlap the trench line SL1_T and the first sensing pattern SP1E on the plane.

The bridge part BP may be on a layer different from that on which the line part LP is located. The bridge part BP connects the line parts LP that are spaced apart from each other. The bridge part BP is connected to the line parts LP through set or predetermined contact holes CN_L.

The bridge part BP overlaps the trench line SL1_T on the plane. The bridge part BP is on a layer different from that on which the trench line SL1_T is on. The bridge part BP may cross the fourth portion P4 and the fifth portion P5 so as to be insulated from each of the fourth portion P4 and the fifth portion P5.

The bridge part BP has conductivity (e.g., electrical conductivity) that is relatively lower than that of the line part LP. The bridge part BP has conductivity (e.g., electrical conductivity) that is relatively lower than that of the trench line SL1_T. For example, the bridge part BP may include transparent conductive oxide. In some embodiments, each of the line parts LP may include a first layer including a metal and a second layer on the first layer including the same material as the bridge part BP. In some embodiments, the second layer may contact or directly contact the first layer in a cross-sectional view.

Referring to FIG. 7A, the bridge part BP is between the display unit 210 and the first layer L1. The line parts LP are between the first layer L1 and the second layer L2. The line parts LP may be on the same layer as the fifth portion P5 and may be spaced apart from each other on the plane. The contact hole CN_L may pass through the first layer L1 to connect the line parts LP to the bridge part BP. Thus, an occurrence of an electrical short-circuit of the connection line BL and the trench line SL1_T may be prevented or reduced.

Referring to FIG. 7B, the trench line SL1_T may be on a layer different from that on which the bridge part BP is on and may be connected to the first sensing pattern SP1E through the contact hole CN_S passing through the first layer L1. The bridge part BP may be on the same layer as the first sensing pattern SP1E. When the bridge part BP includes the same (e.g., substantially the same) material as the first sensing pattern SP1E, the bridge part BP may be formed through the same (e.g., substantially the same) process as the first sensing pattern SP1E, and thus, the manufacturing process may be simplified. However, the present disclosure is not limited thereto. For example, the bridge part BP may include a material different from that of the first sensing pattern SP1E, but the present disclosure is not limited thereto.

According to embodiments of the present disclosure, the trench line SL1_T and the bridge part BP may be designed so that the trench line SL1_T, which is located at a relatively upper side and has high conductivity (e.g., low specific resistance, low electrical resistance, or low sheet resistance), has a surface area greater than that of the bridge part BP, which is located at a relatively lower side and has low conductivity (e.g., low electrical conductivity), to prevent or reduce damage to the connection line BL due to introduction of static electricity. Because the third to fifth portions P3, P4, and P5 of the trench line SL1_t, each of which has a relatively large surface area, include the same (e.g., substantially the same) material as the first and second portions P1 and P2 and the material includes a metal having high conductivity (e.g., high electrical conductivity), the static electricity introduced through the trench line SL1_T may be stably dispersed through the wide (e.g., large) area of the trench line SL1_T. Thus, the introduction of the static electricity into the bridge part BP having a relatively small surface area, and the occurrence of the short-circuit between the trench line SL1_T and the connection line BL due to the introduction of the static electricity may be prevented or reduced to improve electrical reliability of the sensing unit 220.

A width WD_L of the connection line BL (e.g., a width of the line part LP of the connection line BL) in the second direction DR2 (hereinafter, referred to as a width of the line part) and a width WD_S of the trench line SL1_T (e.g., a width of the fourth portion P4 or the fifth portion P5 of the trench line SL1_T) in the first direction DR1 (hereinafter, referred to as a width of the fourth portion or the fifth portion) may be designed in (e.g., may have) various suitable values. Each of the width WD_L of the line part and the width WD_S of the fourth portion or the fifth portion may be greater than that of the first portion P1 of the trench line SL1_T or of the normal line SL1_N. According to an embodiment of the present disclosure, as a difference between the width WD_L of the line part and the width WD_S of the fourth portion or the fifth portion decreases, the damage due to the introduction of the static electricity and the occurrence of the electrical short-circuit on the crossing area between the trench line SL1_T and the connection line BL may be prevented or reduced to improve the electrical reliability.

The sensing unit 220 according to an embodiment of the present disclosure may include dummy lines DML. The dummy lines DML may be between the first sensing pattern SP1E and the connection line BL, between the connection line BL and the trench line SL1_T, between the trench line SL1_T and the normal line SL1_N, and/or between the connection line BL and the normal line SL1_N. The dummy lines DML may be on the same layer as the trench line SL1_T and the line part LP.

The dummy lines DML may be designed to have floating patterns to which a separate electrical signal is not applied or may receive a ground voltage. The dummy lines DML may prevent or reduce electrical interference between adjacent conductive patterns, to which different signals are applied. In some embodiments, light reflectance in a space between the conductive patterns, for example, the first sensing pattern SP1E, the connection line BL, the trench line SL1_T, and the normal line SL1_N, may be substantially the same as that in a region in which the conductive patterns are located, through the dummy lines DML. For example, in some embodiments, light reflectance in regions corresponding to conductive patterns may be substantially the same as the light reflectance in regions corresponding to dummy lines DML between the conductive patterns. Therefore, the limitation of visibility of the conductive patterns due to reflection of external light may be improved.

As illustrated in FIG. 8A, in the sensing unit 220 according to an embodiment of the present disclosure, a connection line BL-1 may include a bridge part BP and a plurality of line parts LPa and LPb. The bridge part BP may correspond to the bridge part BP of FIG. 7A.

The line parts LPa and LPb may have structures that are different from each other. A first line part LPa of the line parts LPa and LPb may correspond to the line part LP of FIG. 7A. A second line part LPb of the line parts LPa and LPb may include a first pattern LP1 and a second pattern LP2, which are on layers that are different from each other.

The first pattern LP1 is on the same layer as the bridge part BP. The second pattern LP2 is on the first pattern LP1. The second pattern LP2 may contact (e.g., directly or physically contact) the first pattern LP1. In some embodiments, a portion aa1 of the second pattern LP2 may be on the first layer L1 so as to be spaced apart from the first pattern LP1, and the other portion aa2 of the second pattern LP2 may pass through the first layer L1 to contact (e.g., directly or physically contact) the first pattern LP1. A contact surface CNT may correspond to a front surface (e.g., a top surface) of the first pattern LP1.

As illustrated in FIG. 8B, the sensing unit 220 according to an embodiment of the present disclosure may include a lower pattern P51. The lower pattern P51 may overlap the third portion P3 of the trench line SL1_T on the plane and contact (e.g., directly or physically contact) the third portion P3. The third portion P3 passes through the first layer L1 to contact (e.g., directly or physically contact) the lower pattern P51. A contact area between the third portion P3 and the lower pattern P51 may be about ½ or more of a planar area of the lower pattern P51.

According to embodiments of the present disclosure, at least a portion of the connection line BL-1 or at least a portion of the trench line SL1_T may be designed as a structure, in which a plurality of conductive patterns directly contact (e.g., physically contact) each other and are laminated (e.g., and are then laminated), to reduce the electrical resistance of the connection line BL-1 or of the trench line SL1_T. In some embodiments, even though damage to the connection line BL-1 and to the trench line SL1_T occurs, the transmission of the electrical signal may be maintained through the first pattern LP1 and the lower pattern P51 at the lower side to improve the reliability of the sensing unit 220.

Figure 9:
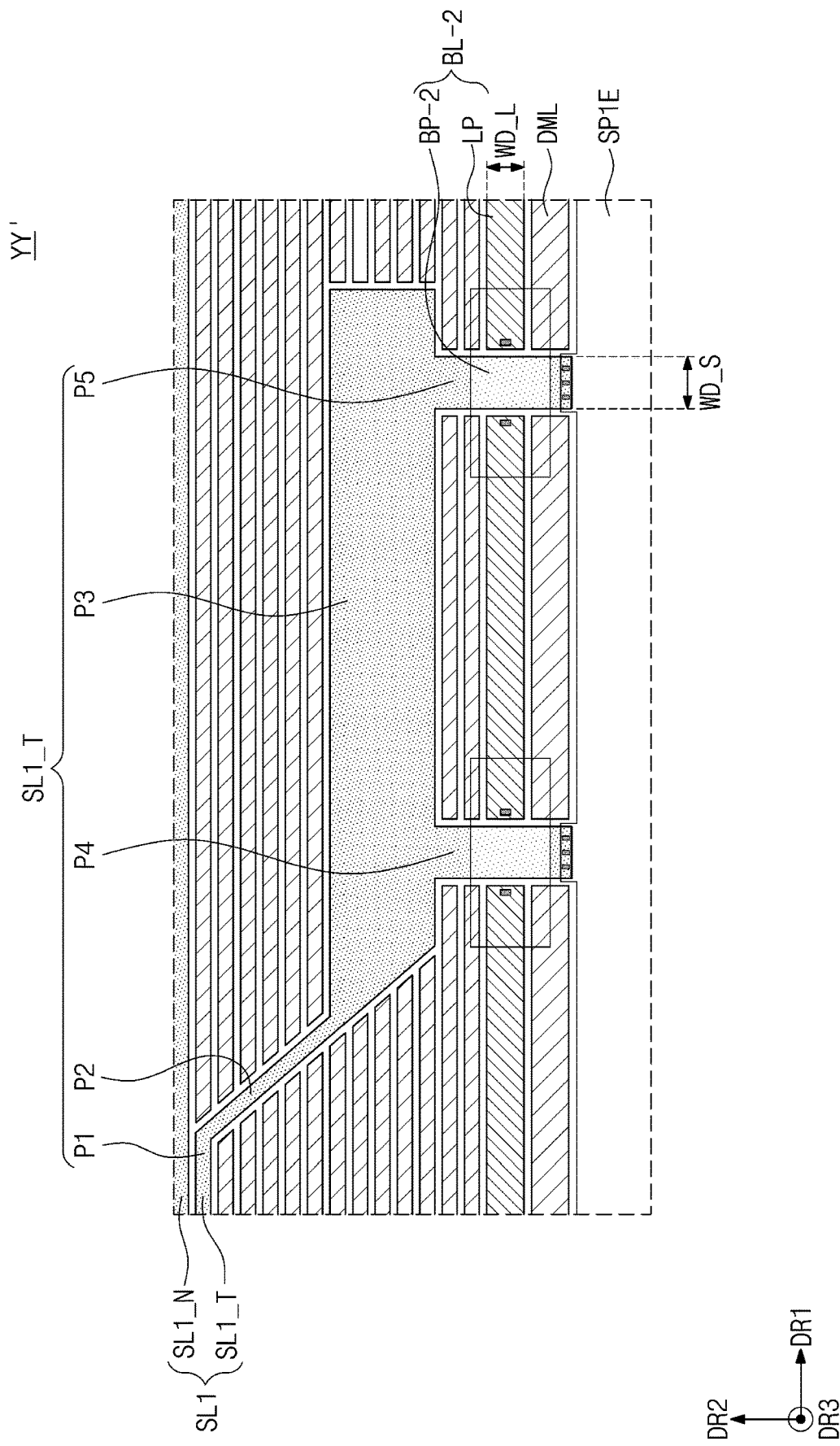
FIG. 9 is an enlarged plan view illustrating a portion of a sensing unit according to an embodiment of the present disclosure.
Figure 10A:
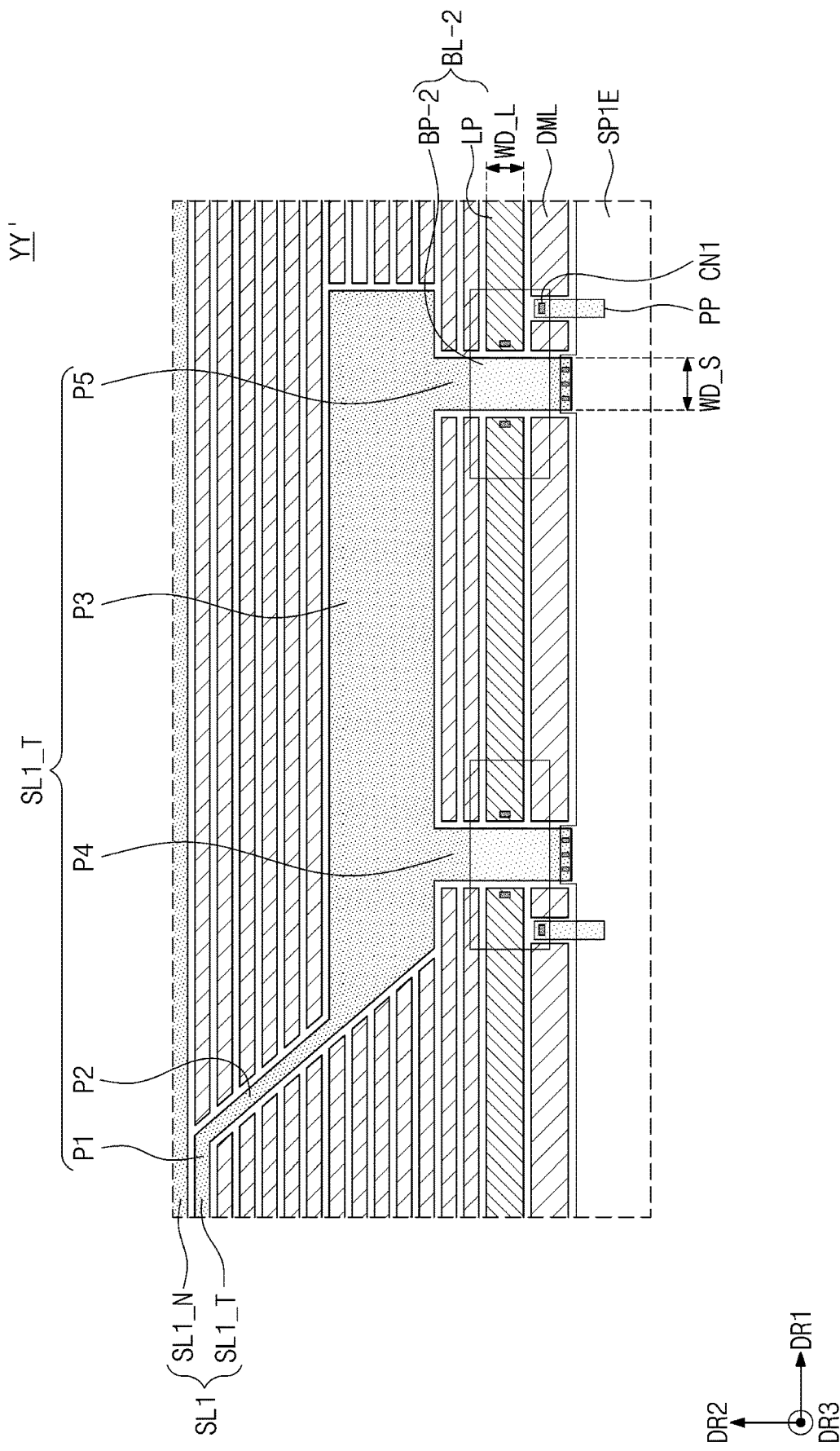
FIGS. 10A and 10B are enlarged plan views each illustrating a portion of a sensing unit according to an embodiment of the present disclosure.
Figure 10B:
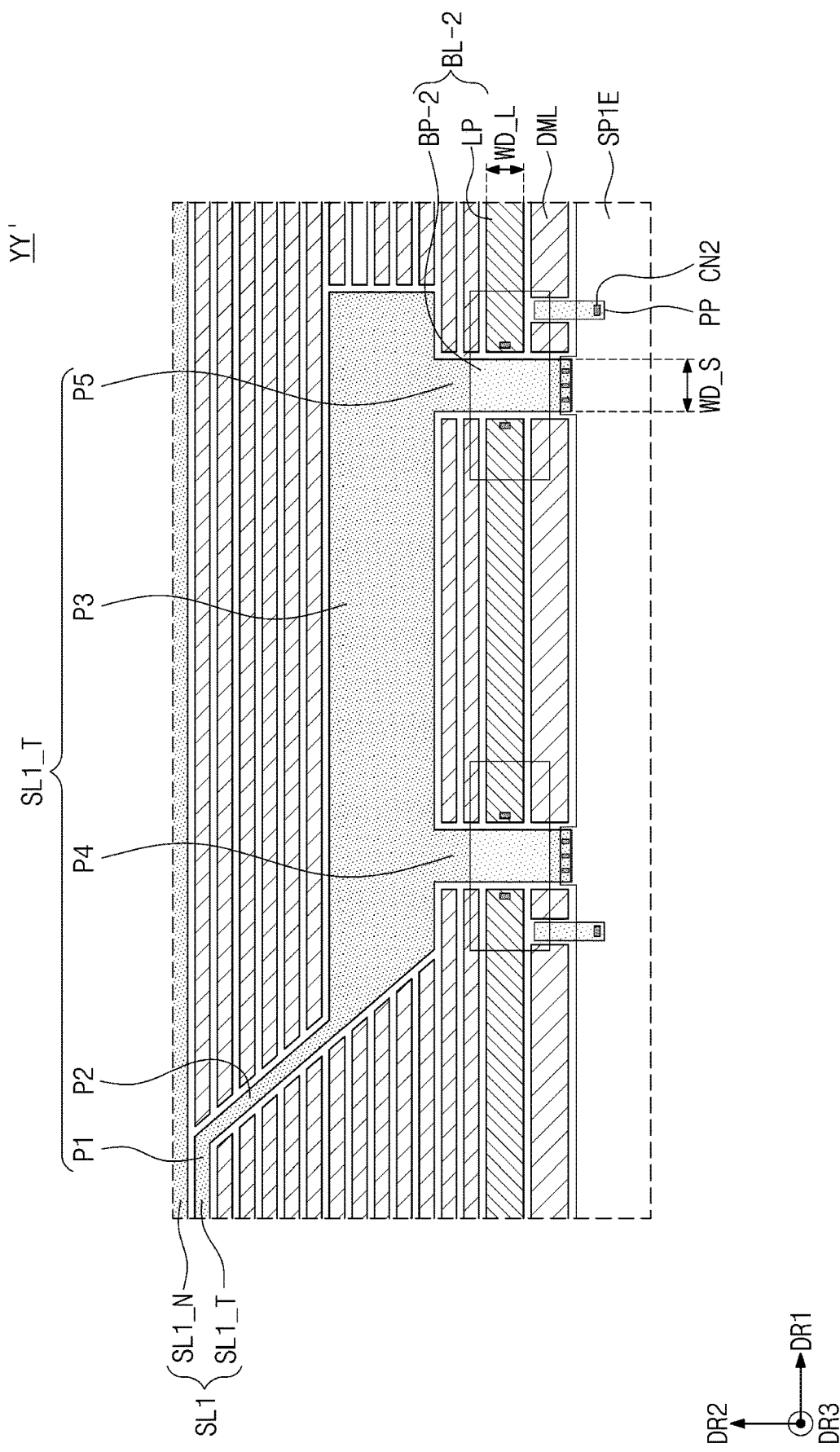

FIG. 9 is an enlarged plan view illustrating a portion of the sensing unit according to an embodiment of the present disclosure. FIGS. 10A and 10B are enlarged plan views illustrating a portion of each of the sensing units according to an embodiment of the present disclosure. For convenience of description, FIGS. 9 to 10B illustrate an area corresponding to the area YY' of FIG. 4. Hereinafter, some embodiments of the present disclosure will be described with reference to FIGS. 9 to 10B. The same reference numerals may be given to the same components as those of FIGS. 1 to 8B, and duplicative descriptions thereof will not be repeated here.

As illustrated in FIG. 9, in the sensing unit 220 according to an embodiment of the present disclosure, a connection line BL-2 may include a bridge part BP-2 having various suitable sizes. The bridge part BP-2 may have an area that overlaps at least a portion of the dummy lines DML as well as at least a portion of the line part LP. Because the bridge part BP-2 increases in surface area by the connection line BL-2, the static electricity introduced into the bridge part BP-2 may be easily dispersed. For example, because the width of the bridge part BP-2 of the connection line BL-2 is greater than the width of the line part LP of the connection line BL-2, the static electricity introduced into the bridge part BP-2 may be easily dispersed.

Some (e.g., most) of the static electricity introduced into the bridge part BP-2 may be dispersed to a front surface of the connection line BL-2 through the line part LP. However, the static electricity partially remaining in the bridge part BP-2 may be dispersed to an edge of the bridge part BP-2. Because the bridge part BP-2 is designed so that the bridge part BP-2 has an area greater than the crossing area between the trench line SL1_T and the connection line BL-2, the damage to the conductive patterns due to the static electricity within the crossing area between the trench line SL1_T and the connection line BL-2 may be easily prevented or reduced. For example, in some embodiments, the crossing area between the trench line SL1_T and the connection line BL-2 may be an area corresponding to a portion of the trench line SL1_T that overlaps the bridge part BP-2 or to a portion of the trench line SL1_T that is between two parts of the line part LP of the connection line BL-2 that is connected by the bridge part BP-2.

In some embodiments, as illustrated in FIGS. 10A and 10B, the sensing unit 220 according to an embodiment of the present disclosure may include an electrostatic induction pattern PP. The electrostatic induction pattern PP may be connected to the bridge part BP-2 through a contact part CN1, as illustrated in FIG. 10A, or may be connected to the first sensing pattern SP1E through a contact part CN2, as illustrated in FIG. 10B. The electrostatic induction pattern PP is on a layer different from that on which the bridge part BP-2 or the first sensing pattern SP1E is on.

In some embodiments, the electrostatic induction pattern PP may include a metal having high conductivity (e.g., high electrical conductivity). The electrostatic induction pattern PP may be spaced apart from the dummy lines DML and/or the line part LP of the connection line BL-2 on the plane. When the electrostatic induction pattern PP includes (e.g., is) the same (e.g., substantially the same) material as the dummy lines DML and/or the line part LP, the electrostatic induction pattern PP may be formed at the same (e.g., substantially the same) time as when the dummy lines DML and the line part LP are formed. Thus, the process (e.g., the manufacturing process) may be simplified, and process costs may be reduced.

The electrostatic induction pattern PP may be a path in which the static electricity introduced into the bridge part BP-2 or the first sensing pattern SP1E is dispersed. A moving path of the static electricity (e.g., a path along which the static electricity can move) introduced into the bridge part BP-2 or the first sensing pattern SP1E may be limited to the electrostatic induction pattern PP to easily control the dispersion of the static electricity. In addition, the electrostatic induction pattern PP may be at a position that is spaced apart from the crossing area between the trench line SL1_T and the connection line BL-2 to prevent or reduce damage to the crossing area between the trench lines SL1_T and the connection line BL-2 even though the electrostatic induction pattern PP is damaged by the static electricity, thereby improving the electrical reliability of the detection unit.

Figure 11A:
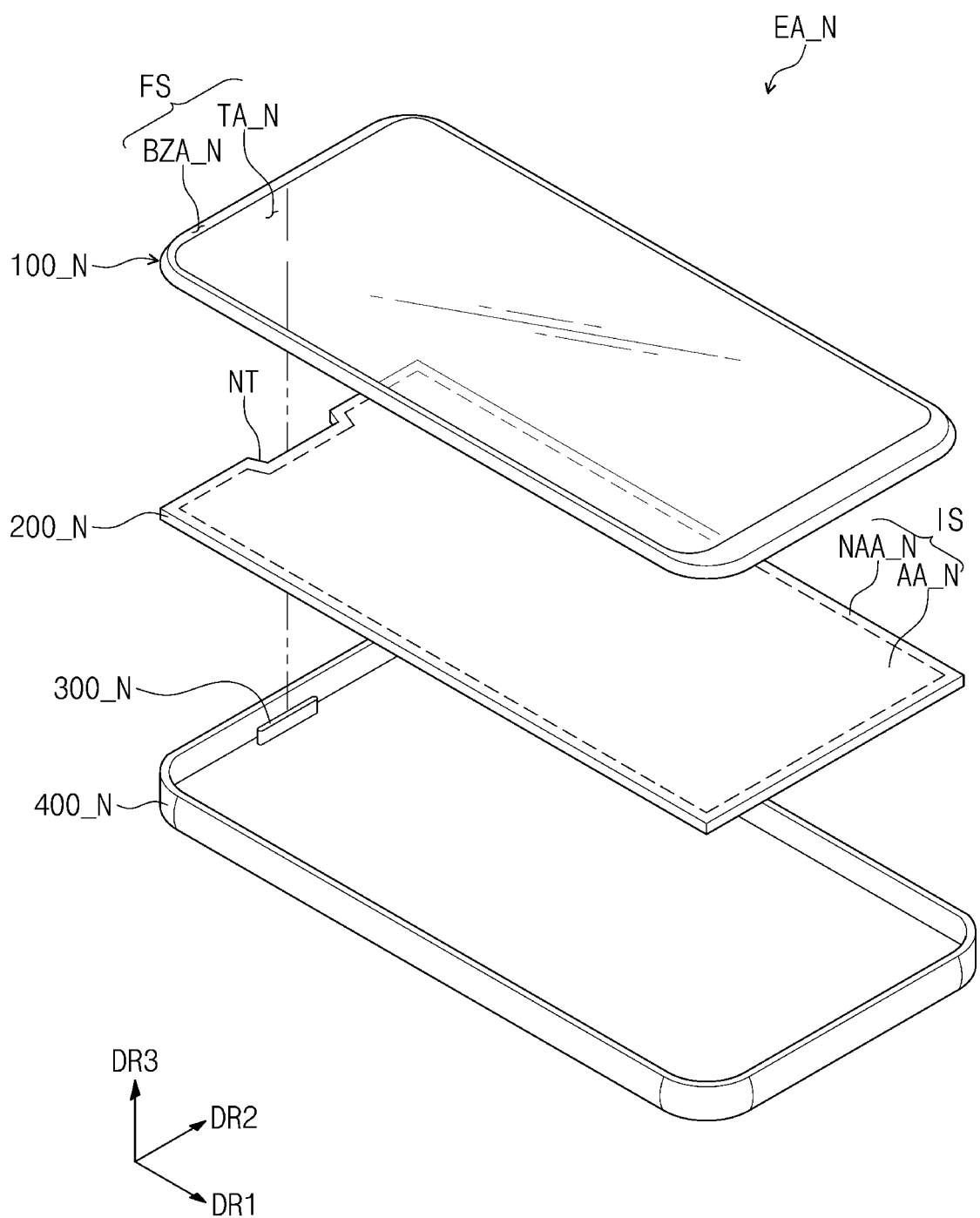
FIG. 11A is an exploded perspective view of an electronic apparatus according to an embodiment of the present disclosure.
Figure 11B:
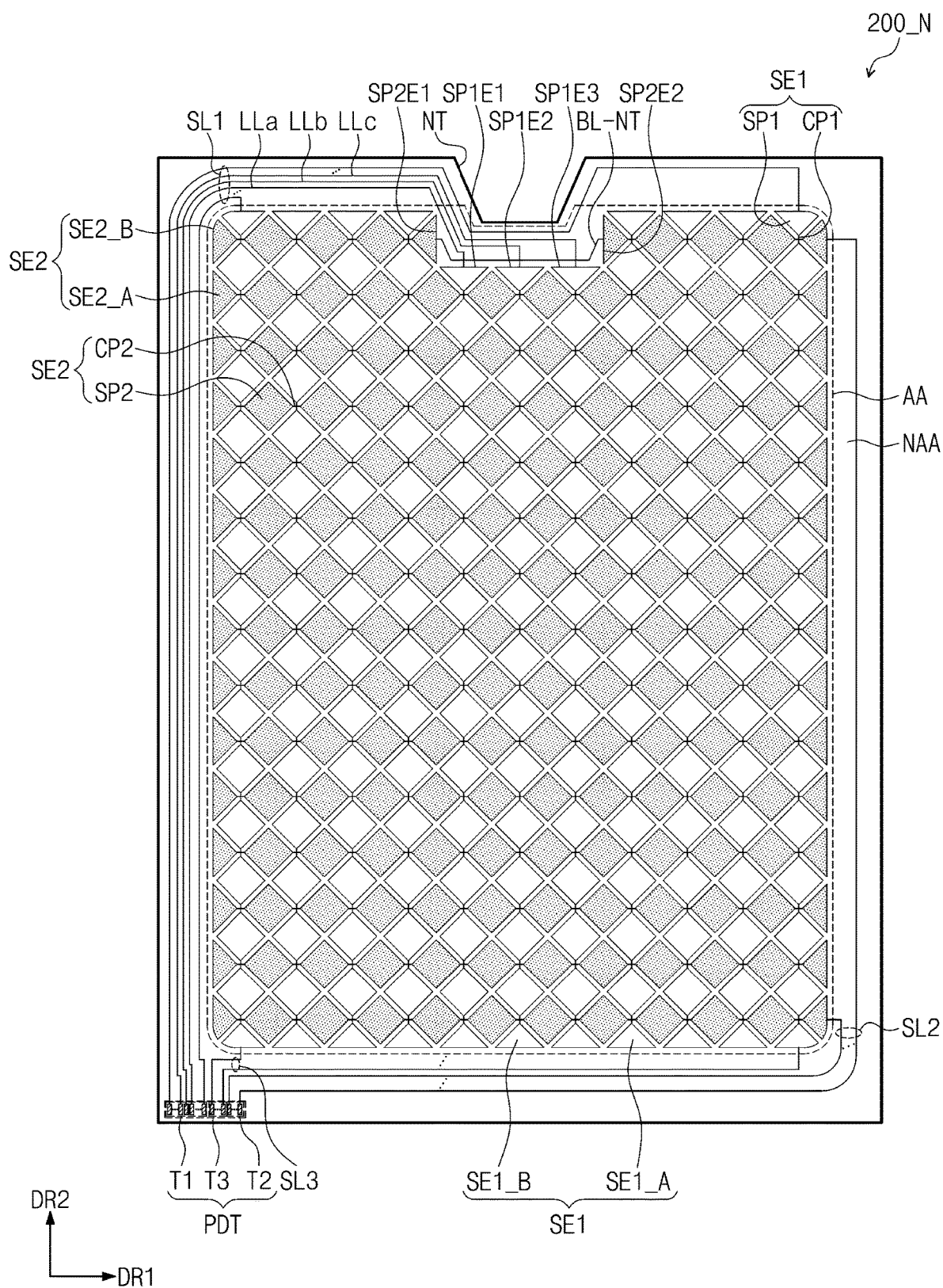
FIG. 11B is a plan view illustrating a portion of constituents of the electronic apparatus of FIG. 11A.

FIG. 11A is an exploded perspective view of an electronic apparatus according to an embodiment of the present disclosure. FIG. 11B is a plan view illustrating a portion of constituents of the electronic apparatus of FIG. 11A. Hereinafter, some embodiments of the present disclosure will be described with reference to FIGS. 11a and 11B. The same reference numerals may be given to the same components as those of FIGS. 1 to 10B, and duplicative descriptions thereof will not be repeated here.

As illustrated in FIG. 11A, an electronic apparatus EA_N may include a window 100_N, an electronic panel 200_N, an electronic module 300_N, and an external case 400_N. A front surface FS of the window 100_N includes a bezel area BZA_N and a transmission area TA_N.

The electronic panel 200_N may include a notch part NT instead of the trench part TRH of the electronic panel 200 (see FIG. 2). The notch part NT may have a width greater than that of the trench part TRH in the second direction DR2.

A front surface IS of the electronic panel 200_N includes an active area AA_N and a peripheral area NAA N. The notch part NT may have a shape that passes through the electronic panel 200_N and is recessed in a direction of the active area AA_N (e.g., in the first direction DR1 in this embodiment) along one edge of the electronic panel 200_N. For example, in some embodiments, a portion of a side of the active area AA_N, and a portion of a side of the electronic panel 200_N, at which the notch part NT is located may be recessed away from the side of the active area AA_N and from the side of the electronic panel 200_N, respectively.

The electronic module 300_N may be at a position that overlaps an area of the electronic panel 200_N, which is opened by the notch part NT, on the plane. The electronic module 300_N may be inserted into the notch part NT and may be adjacent to the window 100_N without the electronic panel 200_N being therebetween (e.g., without the electronic panel 200_N being between the electronic module 300_N and the window 100_N). Thus, the electronic apparatus EA_N having a thin thickness may be formed, and an increase of the bezel area BZA_N may be prevented or reduced.

The external case 400_N may correspond to the external case 400 of FIG. 2, and thus, duplicative description thereof will not be repeated here.

FIG. 11B illustrates the electronic panel 200_N, and for convenience of description, an area corresponding to that of FIG. 4 is illustrated. As illustrated in FIG. 11B, in the sensing unit, a first sensing electrode SE1 may include a plurality of first column electrodes SE1_A and a plurality of second column electrodes SE1_B overlapping the notch part NT in the second direction DR2. For example, each of the second column electrodes SE1_B may extend along a line in the second direction DR2 that crosses the notch part NT. The first column electrodes SE1_A may be electrodes that do not overlap the notch part NT in the second direction DR2. For example, each of the first column electrodes SE1_A may extend along a line in the second direction DR2 that does not cross the notch part NT. Each of the second column electrodes SE1_B may have a length less than that of each of the first column electrodes SE1_A in the second direction DR2.

The second column electrodes SE1_B according to an embodiment of the present disclosure may correspond to the second column electrodes SE1_B of FIG. 4. The second column electrodes SE1_B may include first sensing patterns SP1E1, SP1E2, and SP1E3, which face the notch part NT and are closest to the notch part NT.

The second sensing electrode SE2 may include a plurality of first row electrodes SE2_A and a second row electrode SE2_B. In some embodiments, the second row electrode SE2_B may be provided in a singular (e.g., may include a single row electrode SE2_B). The second row electrode SE2_B may substantially correspond to the second row electrode SE2_B of FIG. 3. Hereinafter, duplicative descriptions will not be repeated. However, the present disclosure is not limited thereto. For example, the number of second column electrodes SE1_B and second row electrodes SE2_B may be variously provided (e.g., may be any suitable number).

The first sensing line SL1 may include a plurality of trench lines LLa, LLb, and LLc. The trench lines LLa, LLb, and LLc may be connected to the second column electrodes SE1_B adjacent to the notch part NT, respectively. The trench lines LLa, LLb, and LLc are connected to the first sensing patterns SP1E1, SP1E2, and SP1E3 facing the notch part NT, respectively.

A connection line BL-NT connects two second sensing patterns SP2E1 and SP2E2 of the second row electrode SE2_B, which are spaced apart from each other by the notch part NT. The connection line BL-NT may overlap the trench lines LLa, LLb, and LLc on the plane. The connection line BL-NT may cross the trench lines LLa, LLb, and LLc so as to be insulated from the trench lines LLa, LLb, and LLc. Thus, the connection line BL-NT and the trench lines LLa, LLb, and LLc may transmit electrical signals, which are independent from each other, to an area adjacent to the notch part NT.

According to embodiments of the present disclosure, each of the trench lines LLa, LLb, and LLc may include a metal having high conductivity (e.g., high electrical conductivity), and a portion of the connection line BL-NT, which overlaps the trench lines LLa, LLb, and LLc, may include a material having relatively low conductivity (e.g., relatively low electrical conductivity). Thus, damage to the trench lines LLa, LLb, and LLc or to the connection line BL-NT due to static electricity introduced through the trench lines LLa, LLb, and LLc may be prevented or reduced. Thus, electrical reliability of the electronic panel 200_N on the area adjacent to the notch part NT may be improved.

According to embodiments of the present disclosure, the static electricity inducted to (e.g., introduced into) the electronic apparatus may be dispersed through the wide area to prevent or reduce damage to or electrical short-circuiting of the conductive patterns due to the occurrence of the static electricity on the narrow area. According to embodiments of the present disclosure, damage to the sensing unit that is designed in various suitable shapes may be prevented or reduced to improve the electrical reliability of the electronic apparatus.

It will be apparent to those skilled in the art that various modifications and variations can be made to the subject matter of the present disclosure. Thus, it is intended that the present disclosure covers the modifications and variations of the disclosed subject matter, provided they come within the scope of the appended claims and their equivalents.

Hence, the real protective scope of the present disclosure shall be determined by the technical scope of the accompanying claims, and equivalents thereof.

What is claimed is:

1. An electronic apparatus comprising:
   a base substrate;
   a plurality of first sensing electrodes on the base substrate;
   a plurality of second sensing electrodes spaced apart from the first sensing electrodes;
   a plurality of first sensing lines connected to ends of the first sensing electrodes, respectively;
   a plurality of second sensing lines respectively connected to ends of the second sensing electrodes and spaced apart from the first sensing lines; and
   a connection line to connect two second sensing patterns, which are spaced apart from each other, among second sensing patterns of one second sensing electrode of the second sensing electrodes to each other,
   wherein each of the first sensing lines comprises a trench line connected to one first sensing electrode of the first sensing electrodes and crossing the connection line so as to be insulated from the connection line, and
   wherein the connection line comprises:
   a plurality of line parts on the same layer as the trench line and spaced apart from each other with the trench line therebetween on a plane; and
   a bridge part on a layer that is different from that on which the line parts are on and overlapping the trench line on the plane, the bridge part connecting the line parts to each other,
   wherein the bridge part has conductivity less than that of the trench line.

2. The electronic apparatus of claim 1, wherein the trench line is on the bridge part in a cross-section.

3. The electronic apparatus of claim 2, wherein each of the line parts comprises a metal, and
   the bridge part comprises a transparent conductive oxide.

4. The electronic apparatus of claim 3, wherein each of the line parts comprises:
   a first layer comprising the metal; and
   a second layer on the first layer and comprising the same material as the bridge part,
   wherein the first layer and the second layer contact each other in the cross-section.

5. The electronic apparatus of claim 1, wherein the trench line comprises:
   a first portion extending in a first direction and spaced apart from the first sensing electrode in a second direction crossing the first direction;
   a second portion extending from the first portion in the second direction and connected to the first sensing electrode; and
   a third portion spaced apart from the first portion with the second portion therebetween to extend from the second portion,
   wherein the bridge part extends in the first direction.

6. The electronic apparatus of claim 5, wherein a width of the second portion in the first direction is substantially the same as the width of each of the line parts in the second direction.

7. The electronic apparatus of claim 5, further comprising at least one metal pattern between the first portion and the first sensing electrode,
   wherein the metal pattern is on the same layer as the trench line and comprises the same material as the trench line.

8. The electronic apparatus of claim 1, further comprising an electrostatic induction pattern overlapping the bridge part on the plane and comprising the same material as the line parts.

9. The electronic apparatus of claim 8, wherein the electrostatic induction pattern is connected to the bridge part.

10. The electronic apparatus of claim 8, wherein the electrostatic induction pattern is connected to the first sensing electrode.

11. The electronic apparatus of claim 1, further comprising a trench part passing through the base substrate,
    wherein the trench part is connected to at least one edge of the base substrate.

12. The electronic apparatus of claim 11, wherein the connection line is between the trench part and the first sensing electrode on the plane.

13. The electronic apparatus of claim 1, further comprising an organic light emitting element on the base substrate and an encapsulation layer configured to cover the organic light emitting element,
  wherein the first sensing electrodes and the second sensing electrodes are on the encapsulation layer in a cross-section.

14. An electronic apparatus comprising:
  a first sensing electrode comprising a first column electrode having a first length in a first direction and a second column electrode having a length in the first direction less than the first length;
  a second sensing electrode comprising a first row electrode having a second length in a second direction different from the first direction and a second row electrode having a length in the second direction less than the second length, wherein the second row electrode comprises sensing patterns spaced apart from each other in the second direction;
  a plurality of first sensing lines comprising a normal line connected to the first column electrode and a trench line connected to the second column electrode;
  a plurality of second sensing lines connected to the first row electrode and the second row electrode, respectively; and
  a connection line configured to connect the sensing patterns of the second row electrode to each other, the connection line crossing the trench line so as to be insulated from the trench line,
  wherein the connection line comprises:
    a bridge part overlapping the trench line on a plane; and
    line parts spaced apart from each other with the trench line therebetween, the line parts being connected to each other through the bridge part,
  wherein the trench line is on the bridge part in a cross-section.

15. The electronic apparatus of claim 14, wherein the connection line has conductivity less than that of the trench line.

16. The electronic apparatus of claim 15, wherein the connection line comprises transparent conductive oxide.

17. The electronic apparatus of claim 14, wherein the connection line is spaced apart from the second column electrode on the plane.

18. The electronic apparatus of claim 14, wherein a width of the line part in the first direction is substantially the same as that of the trench line in the second direction.

19. The electronic apparatus of claim 14, further comprising an electrostatic induction pattern on the connection line and connected to the connection line in the cross-section,
  wherein the electrostatic induction pattern is spaced apart from the trench line on the plane.

20. The electronic apparatus of claim 14, further comprising an electrostatic induction pattern connected to the second column electrode on the plane,
  wherein the electrostatic induction pattern is spaced apart from the trench line on the plane.

* * * * *